US011895864B2

(12) United States Patent
Jung et al.

(10) Patent No.: US 11,895,864 B2
(45) Date of Patent: Feb. 6, 2024

(54) DISPLAY DEVICE INCLUDING A FIRST DAM AND A SECOND DAM DISPOSED IN THE PERIPHERAL AREA

(71) Applicant: SAMSUNG DISPLAY CO., LTD., Yongin-si (KR)

(72) Inventors: Soon Il Jung, Cheonan-si (KR); Chi Wook An, Hwaseong-si (KR); Hae Young Yun, Suwon-si (KR); Jung-Hyun Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/664,587

(22) Filed: May 23, 2022

(65) Prior Publication Data

US 2022/0285650 A1 Sep. 8, 2022

Related U.S. Application Data

(63) Continuation of application No. 16/908,920, filed on Jun. 23, 2020, now Pat. No. 11,362,308.

(30) Foreign Application Priority Data

Oct. 16, 2019 (KR) ........................ 10-2019-0128429

(51) Int. Cl.
*H01L 29/08* (2006.01)
*H10K 50/844* (2023.01)
(Continued)

(52) U.S. Cl.
CPC ....... *H10K 50/8445* (2023.02); *H10K 59/124* (2023.02); *H10K 59/40* (2023.02)

(58) Field of Classification Search
CPC ... H10K 50/8445; H10K 59/40; H10K 59/124
(Continued)

(56) References Cited

U.S. PATENT DOCUMENTS

2016/0307971 A1\* 10/2016 Jeon .................... G09G 3/3233
2018/0366520 A1\* 12/2018 Gwon ................ H10K 50/8445
(Continued)

FOREIGN PATENT DOCUMENTS

DE      10200401000 A1 \*  9/2004  ............. H10K 59/38
KR   10-2018-0036616      4/2016
(Continued)

*Primary Examiner* — Phuc T Dang
(74) *Attorney, Agent, or Firm* — F. CHAU & ASSOCIATES, LLC

(57) ABSTRACT

A display device according to embodiments includes: a display panel that includes a display area that includes a partition layer that includes a first opening through which light is emitted from an organic light emitting diode and a peripheral area around the display area; a touch electrode disposed on the display panel; a touch electrode passivation layer that covers the touch electrode and includes a second opening that corresponds to the first opening; and a high refractive index layer that covers the touch electrode passivation layer and the second opening. The touch electrode passivation layer includes an open region formed in a portion that corresponds to the peripheral area, and the touch electrode passivation layer is not formed in the open region.

18 Claims, 18 Drawing Sheets

(51) Int. Cl.
*H10K 59/40* (2023.01)
*H10K 59/124* (2023.01)

(58) Field of Classification Search
USPC .......................................................... 257/40
See application file for complete search history.

(56) References Cited

U.S. PATENT DOCUMENTS

| | | |
|---|---|---|
| 2019/0019966 A1* | 1/2019 | Jiang .................... H10K 77/111 |
| 2019/0019986 A1 | 1/2019 | Jiang et al. |
| 2019/0131354 A1 | 5/2019 | Lee et al. |
| 2019/0243496 A1* | 8/2019 | Lee ....................... H10K 59/126 |
| 2019/0288046 A1* | 9/2019 | Park .................... H10K 59/131 |
| 2021/0119181 A1 | 4/2021 | Jung et al. |

FOREIGN PATENT DOCUMENTS

| | | |
|---|---|---|
| KR | 10-2017-0024288 | 3/2017 |
| KR | 10-2018-0011924 | 2/2018 |
| KR | 10-2018-0079599 | 7/2018 |
| KR | 10-20190003181 | 1/2019 |
| KR | 10-2019-0062878 | 6/2019 |

\* cited by examiner

DISPLAY DEVICE INCLUDING A FIRST DAM AND A SECOND DAM DISPOSED IN THE PERIPHERAL AREA

CROSS-REFERENCE TO RELATED APPLICATION

This application is a continuation of U.S. patent application Ser. No. 16/908,920, filed on Jun. 23, 2020 in the U.S. Patent and Trademark Office, which issued as U.S. Pat. No. 11,362,308 on Jun. 14, 2022, and which claims priority under 35 U.S.C. § 119 from, and the benefit of Korean Patent Application No. 10-2019-0128429, filed in the Korean Intellectual Property Office on Oct. 16, 2019, the contents of both of which are herein incorporated by reference in their entireties.

BACKGROUND

1. Technical Field

Embodiments of the present disclosure are directed to a display device, and more particularly, to a display device that includes a touch sensing function.

2. Discussion of the Related Art

The use of mobile phones is becoming more common, and mobile phones include various functions in addition to those of making phone calls. The various functions typically include a touch sensing function that makes it easier to use a smartphone.

In particular, as the development of flexible organic light emitting devices progresses, display devices are being fabricated by forming an additional layer on the organic light emitting panel to provide the touch sensing function.

SUMMARY

Embodiments provide a display device that can prevent an organic material provided through an inkjet process from flowing to the surroundings to prevent occurrence of foreign materials or to cover alignment marks.

In addition, embodiments provide a display device that has improved light efficiency in front of a touch sensitive organic light emitting device.

A display device according to embodiments includes: a display panel that includes a display area that includes a partition wall that includes a first opening through which light is emitted from an organic light emitting diode and a peripheral area around the display area; a touch electrode disposed on the display panel; a touch electrode passivation layer that covers the touch electrode and includes a second opening that corresponds to the first opening; and a high refractive index layer that covers the touch electrode passivation layer and the second opening, wherein the touch electrode passivation layer includes an open region formed in a portion that corresponds to the peripheral area, wherein the touch electrode passivation layer is not formed in the open region.

The display device may further include an outer dam region formed in the peripheral area outside the open region of the touch electrode passivation layer, where the outer dam region may include a first dam structure formed of a same material and with a same height as the touch electrode passivation layer.

The first dam structure formed in the outer dam region may further include an inner protruded portion.

The first dam structure formed in the outer dam region may further include a dam opening formed at an upper surface of the first dam.

The display device may further include an extension region formed in the peripheral area between the open region of the touch electrode passivation layer and the display area.

The display panel may further include an encapsulation layer that covers the organic light emitting diode and the first opening, and the encapsulation layer may include at least one organic encapsulation layer and at least one inorganic encapsulation layer.

The partition layer may further include a partition layer peripheral opening in the peripheral area that corresponds to the open region.

The display panel may further include an interlayer insulating layer disposed under the organic light emitting diode, and the interlayer insulating layer may include an interlayer insulating layer peripheral opening in the peripheral area that corresponds to the open region.

The display device may further include an additional open region in the peripheral area between the open region and the extension region of the touch electrode passivation layer, and the touch electrode passivation layer is not formed in the additional open region.

The display device may further include an inner dam region in the peripheral area outside the additional open region of the touch electrode passivation layer, and the inner dam region may include a second dam structure formed of a same material and with a same height as the touch electrode passivation layer.

The second dam structure may further include an inner protruded portion.

The second dam structure may further include a dam opening formed at an upper surface of the second dam.

The display panel may further include an encapsulation layer that covers the organic light emitting diode and the first opening, and the encapsulation layer may include at least one organic encapsulation layer and at least one inorganic encapsulation layer.

The at least one organic encapsulation layer may extend to at least a portion of the inner dam region through the extension region and the additional open region, and the at least one inorganic encapsulation layer covers the open region and extends to the outer dam region through the inner dam region.

The partition layer may further include a partition layer peripheral opening in the peripheral area that corresponds to the open region.

The partition layer may further include an additional partition layer peripheral opening in the peripheral area that corresponds to the additional open region.

The display panel may further include an interlayer insulating layer disposed under the organic light emitting diode, and the interlayer insulating layer may include an interlayer insulating layer peripheral opening in the peripheral area that corresponds to the open region.

The interlayer insulating layer may further include an additional interlayer insulating layer peripheral opening in the peripheral area that corresponds to the additional open region.

A display device according to embodiments includes: a display panel that includes a display area and a peripheral area around the display area; a touch electrode disposed on the display panel; a touch electrode passivation layer that covers the touch electrode, where the touch electrode passivation layer includes an open region formed in a portion that corresponds to the peripheral area, where the touch electrode passivation layer is not formed in the open region; a high refractive index layer that covers the touch electrode passivation layer, wherein a same material as that of the high refractive index layer is partially formed in the open region; and an outer dam region formed in the peripheral area outside the open region of the touch electrode passivation layer. The outer dam region includes a first dam structure formed of a same material and with a same height as the touch electrode passivation layer.

The display panel may include a partition layer in the display area and that includes a first opening through which light is emitted from an organic light emitting diode, and the touch electrode passivation layer may include a second opening that corresponds to the first opening, and the high refractive index layer may cover the second opening.

A display device according to embodiments includes: a display panel that includes a display area and a peripheral area around the display area; the display panel comprises: a substrate; and a partition layer disposed over the interlayer insulating layer and having a first opening through which light is emitted from an organic light emitting diode; a touch electrode disposed on the display panel; a touch electrode passivation layer that covers the touch electrode and includes a second opening that corresponds to the first opening; and a high refractive index layer that covers the touch electrode passivation layer and the second opening, wherein the touch electrode passivation layer includes an open region formed in a portion that corresponds to the peripheral area, wherein the touch electrode passivation layer is not formed in the open region, and wherein the partition layer further includes a partition layer peripheral opening in the peripheral area that corresponds to the open region.

The display panel may further include an extension region formed in the peripheral area between the open region of the touch electrode passivation layer and the display area.

The display panel may further include an additional open region in the peripheral area between the open region and the extension region of the touch electrode passivation layer.

The touch electrode passivation layer may not be formed in the additional open region.

The partition layer may further includes an additional partition layer peripheral opening in the peripheral area that corresponds to the additional open region.

The display panel may further include an outer dam region formed in the peripheral area outside the open region of the touch electrode passivation layer, and an inner dam region in the peripheral area outside the additional open region of the touch electrode passivation layer.

The outer dam region may include a first dam structure formed of a same material and with a same height as the touch electrode passivation layer, and the inner dam region may include a second dam structure formed of a same material and with a same height as the touch electrode passivation layer.

The open region and the partition layer peripheral opening may overlap each other in a plan view.

According to embodiments, an occurrence of a carbonized foreign material or the covering of the alignment mark due to the flow of the organic material provided through the inkjet process are prevented.

In addition, embodiments improve the light efficiency at the front of a touch sensitive organic light emitting device.

DETAILED DESCRIPTION

Figure 1:
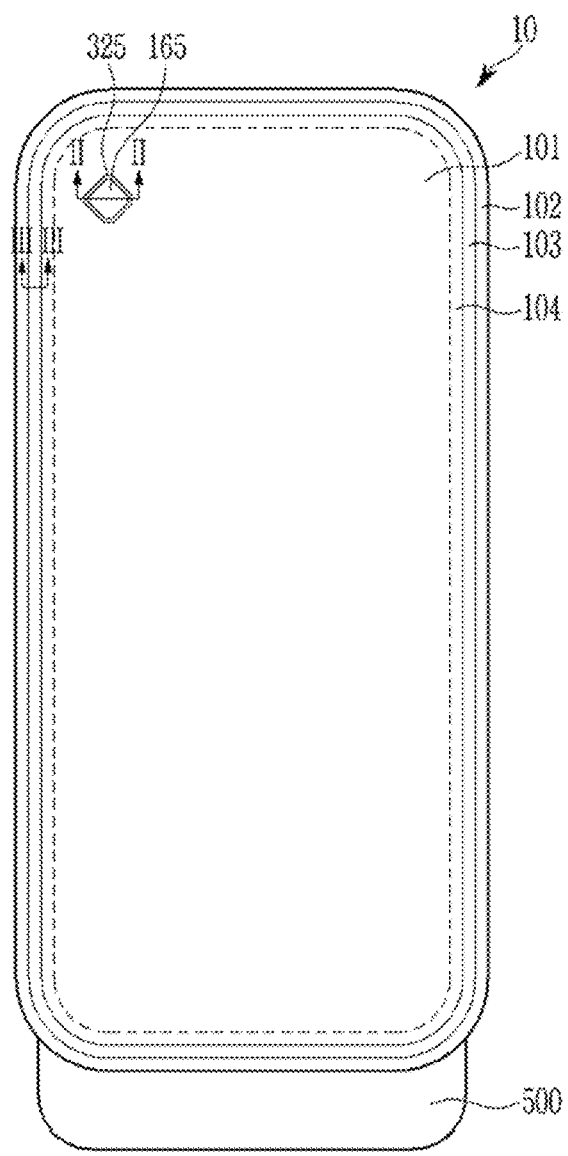
FIG. 1 is a schematic front view of a display device according to an embodiment.

Embodiments of the present disclosure will be described more fully hereinafter with reference to the accompanying drawings, in which embodiments of the disclosure are shown. As those skilled in the art would realize, embodiments may be modified in various different ways, all without departing from the spirit or scope of the present disclosure.

In addition, the size and thickness of each configuration shown in the drawings are arbitrarily shown for better understanding and ease of description, but embodiments of the present disclosure are not limited thereto. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Next, a display device 10 according to an embodiment is described with reference to FIG. 1 to FIG. 3.

Figure 2:
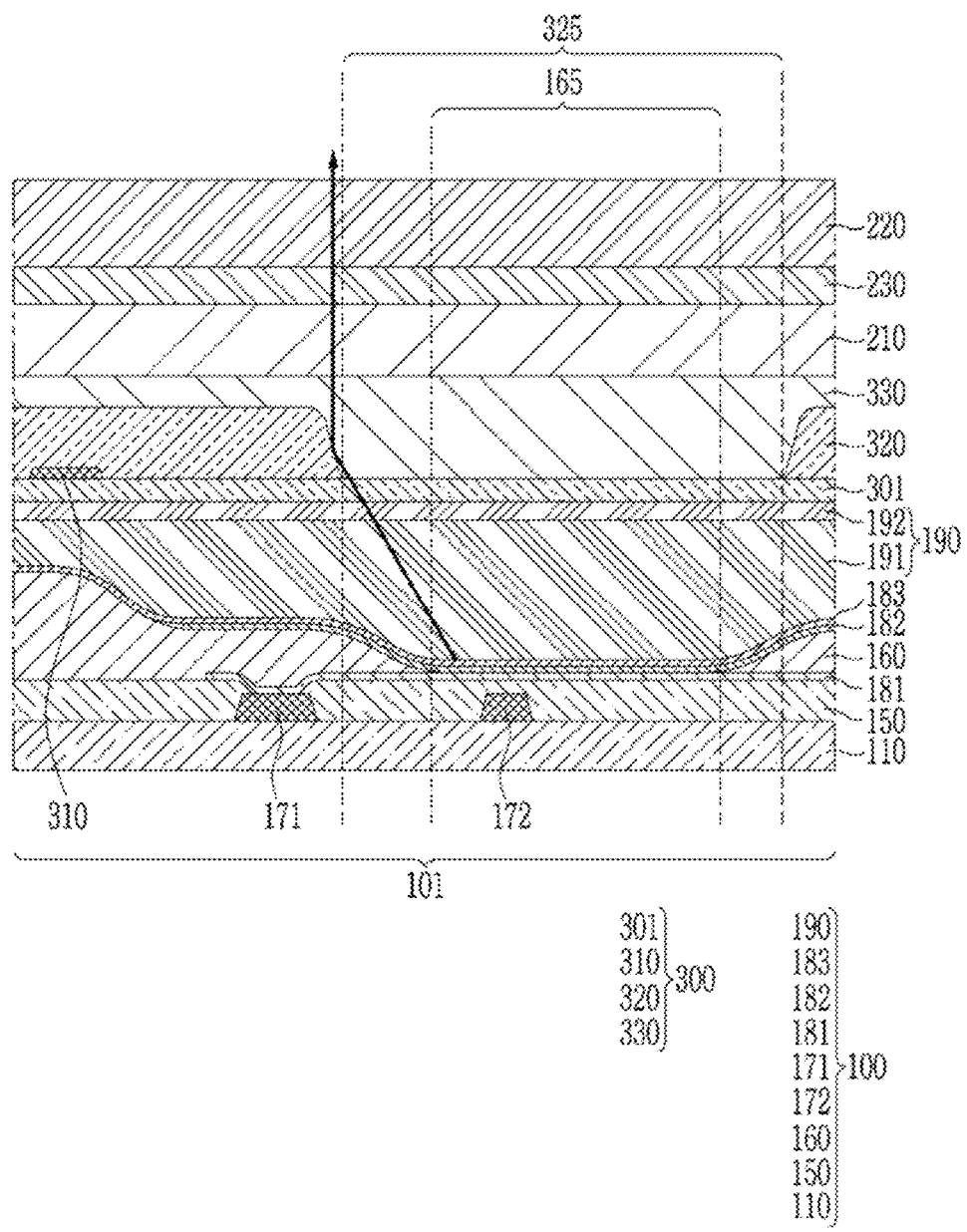
FIG. 2 is a cross-sectional view taken along a line II-II of FIG. 1.
Figure 3:
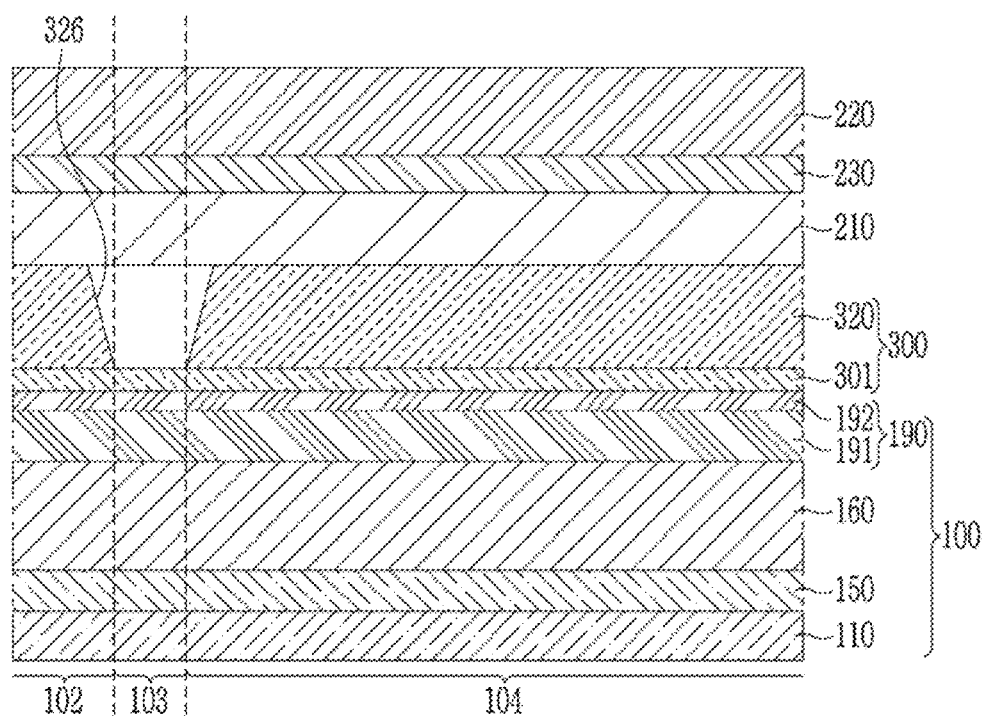
FIG. 3 is a cross-sectional view taken along a line III-III of FIG. 1.

FIG. 1 is a schematic front view of a display device according to an embodiment, FIG. 2 is a cross-sectional view taken along a line II-II of FIG. 1, and FIG. 3 is a cross-sectional view taken along a line III-III of FIG. 1.

Referring to FIG. 2, the display device 10 according to an embodiment includes a display panel 100 that includes an organic light emitting diode, a touch sensing layer 300 disposed on the display panel 100 and that has a touch sensing function, a polarization layer 210 disposed on the touch sensing layer 300, an adhesive layer 230 and a window 220.

Referring to FIG. 1, the display panel 100 according to an embodiment includes a display area 101 in which the organic light emitting diode is formed to display an image, and peripheral areas 102, 103, and 104 enclosing the display area 101. In addition, the display device 10 further includes a driver 500 formed at one side.

According to an embodiment, a plurality of pixels that display an image are formed in the display area 101, and each pixel includes one organic light emitting diode. FIG. 1 shows a pixel opening 165, hereinafter referred to as a first opening, that corresponds to one organic light emitting diode, and since light is emitted through the pixel opening 165, one pixel opening 165 corresponds to one pixel.

Referring to FIG. 2, according to an embodiment, the pixel opening 165 is formed in a partition layer 160. The display panel 100 includes a substrate 110, an interlayer insulating layer 150 disposed on the substrate 110, and organic light emitting diode disposed on the interlayer insulating layer 150. An anode 181, hereinafter referred to as a first electrode, partially covered by the partition layer 160, an organic emission layer 182 formed in the pixel opening 165 of the partition layer 160, and a cathode 183, hereinafter referred to as a second electrode, that covers the organic emission layer 182 and the partition layer 160 configure one organic light emitting diode. Here, the organic emission layer 182 may further include at least one of an electron transport layer, an electron injection layer, a hole transport layer, or a hole injection layer.

According to an embodiment, the pixel opening 165 and the organic light emitting diode are formed in the display area 101 of the display panel 100.

The structure of the display panel 100 is described in more detail with reference to FIG. 2 as follows.

According to an embodiment, the anode 181 of the organic light emitting diode receives a current from an output terminal 171 of one transistor, and the one transistor may be a driving transistor or a switching transistor. In addition, on the same layer as the output terminal 171 of one transistor, a driving voltage line 172 through which a driving voltage is transmitted is disposed.

According to an embodiment, FIG. 2 shows that the anode 181 of the organic light emitting diode and the output terminal 171 of one transistor are electrically connected through an opening of the interlayer insulating layer 150. The output terminal 171 of the one transistor and the driving voltage line 172 are disposed in a data conductive layer.

According to an embodiment, FIG. 2 shows that the output terminal 171 of the one transistor and the driving voltage line 172 are formed on the substrate 110, however various other electrodes and semiconductor layers may be formed between the substrate 110 and the data conductive layer. For example, since one transistor includes a semiconductor layer, a gate electrode, and source and drain electrodes, at least one gate conductive layer and the semiconductor layer may be disposed between the substrate and the data conductive layer. The substrate 110 may be formed of plastic, a flexible polyimide (PI), or glass.

According to an embodiment, the organic light emitting diode and the partition layer 160 are covered by an encapsulation layer 190. The encapsulation layer 190 blocks external air or moisture from penetrating into the organic emission layer 182 of the organic light emitting diode. The encapsulation layer 190 includes at least one organic encapsulation layer 191 and at least one inorganic encapsulation layer 192. Although only one organic encapsulation layer 191 and one inorganic encapsulation layer 192 are shown in FIG. 2, embodiments are not limited thereto, and another layer may be included in other embodiments, and an additional inorganic encapsulation layer may be further formed below the organic encapsulation layer 191. Here, the organic encapsulation layer 191 is formed of a monomer, and the inorganic encapsulation layer 192 is formed of a silicon nitride (SiNx) layer.

According to an embodiment, the encapsulation layer 190 is part of the display panel 100, and referring to FIG. 2, the touch sensing layer 300 is formed on the display panel 100.

According to an embodiment, the touch sensing layer 300 includes a touch sensing insulating layer 301, a touch electrode 310, a touch electrode passivation layer 320, and a high refractive index layer 330.

According to an embodiment, the touch sensing layer 300 also includes a display area 101 and peripheral areas 102, 103 and 104 surrounding thereof, which corresponds to those of the display panel 100, and the touch sensing layer 300 of the display area 101 senses a touch by using the touch electrode 310.

According to an embodiment, the touch electrode passivation layer 320 is disposed on and covers the touch electrode 310, and has an opening 325, in the display area 101 of the touch sensing layer 300 that exposes the touch sensing insulating layer 301. The opening 325 may be referred to as a light path control opening 325 or a second opening 325, and is wider than the pixel opening 165 while overlapping the pixel opening 165.

According to an embodiment, the high refractive index layer 330 is formed on the touch electrode passivation layer 320 and within the light path control opening 325. The high refractive index layer 330 is formed of a material having a higher refractive index than the touch electrode passivation layer 320. As shown by an arrow FIG. 2, the light of the organic light emitting diode emitted through the pixel opening 165 is reflected by the inclined surface of the touch electrode passivation layer 320 so that the light is emitted in a direction substantially normal to the front surface of the display device 10. In this case, if a total reflection condition is satisfied, the light is totally reflected and emitted from the front surface of the display device 10. As light dissipates while propagating to the side in this way, the light efficiency at the front is improved by 10-20%. Here, the high refractive index layer 330 is formed of a monomer.

According to an embodiment, the peripheral areas 102, 103, and 104 form three regions in FIG. 1, and a classification of the regions is based on the structure of the touch electrode passivation layer 320 of the touch sensing layer 300. That is, referring to FIG. 3, the touch electrode passivation layer 320 of the touch sensing layer 300 is formed in the display area 101 and the partial regions 102 and 104 of the peripheral area, and the touch electrode passivation layer material is not disposed in an open region 103 of the peripheral area to form a peripheral opening 326. The touch sensing insulating layer 301 is exposed in the open region 103. Of the two regions separated by the peripheral opening 326, region 102 is referred to as an outer dam region and region 104 is referred to as an extension region 104.

According to an embodiment, in the outer dam region 102, a first dam structure that has the same material and the same height as the touch electrode passivation layer 320 is formed, and the first dam structure is disposed outside the open region 103.

According to an embodiment, the extension region 104 is formed between the open region 103 and the display area 101, and the touch electrode passivation layer 320 extends continuously from the display area 101 into the extension region 104.

According to an embodiment, the encapsulation layer 190 extends to the ends of the peripheral regions 102, 103, and 104, however it has a structure in which the organic encapsulation layer 191 extends only up to some regions of the peripheral areas 102, 103, and 104 and the inorganic encapsulation layer 191 extends to the end in the remaining region. Depending on an embodiment, the end portion of the organic encapsulation layer 191 may vary, but in a present embodiment, the organic encapsulation layer 191 extends through the open region 103 and the extension region 104 to the portion of the outer dam region 102, and the inorganic encapsulation layer 192 is disposed at the outside thereof. In FIG. 3, only the portion where both the organic encapsulation layer 191 and the inorganic encapsulation layer 192 are formed is shown in the cross-section.

Referring to FIG. 2 and FIG. 3, according to an embodiment, the high refractive index layer 330 is not formed in the peripheral areas 102, 103, and 104. In the display area 101, the high refractive index layer 330 is formed by an inkjet method to fill the light path control opening 325, and the high refractive index layer 330 is not formed in the peripheral areas 102, 103, and 104 because the material for the high refractive index layer 330 is not sprayed in those regions. However, when actually spraying the material for the high refractive index layer 330, some material may flow towards the peripheral areas 102, 103, and 104. But even if the high refractive index layer 330 material is formed in a portion of the upper region of the extension region 104 or beyond the extension region 104, it is confined in the open region 103, so that it is not formed above or beyond the outer dam region 102. In this case, the material for the high refractive index layer 330 is formed on the extension region 104 or in the open region 103 of the peripheral areas 102, 103, and 104. In FIG. 3, the high refractive index layer 330 material is omitted for clarity.

According to an embodiment, if the high refractive index layer 330 material is sprayed beyond the outer dam region 102, defects may occur in subsequent processes. That is, when subsequently cutting the substrate, the substrate is cut using a laser, and at this time, the high refractive index layer 330 material can react with the laser and generate carbonized foreign materials that cover alignment marks formed for substrate alignment, thereby causing a misalignment.

According to an embodiment, to prevent this situation, the open region 103 and the outer dam region 102 are formed in the touch electrode passivation layer 320 layer below the layer on which the high refractive index layer 330 material is formed so that the high refractive index layer 330 material does not flow over the outer dam region 102.

According to an embodiment, the touch electrode 310 is formed on the touch sensing insulating layer 301, and the touch sensing insulating layer 301 is formed of a silicon nitride (SiNx).

According to an embodiment, the touch electrode 310 formed in the display area 101 of the touch sensing layer 300 is only formed where the touch electrode passivation layer 320 is formed and covered by the touch electrode passivation layer 320 without being formed in the light path control opening 325. As a result, the pixel opening 165 and the touch electrode 310 also do not overlap.

In FIG. 2, according to an embodiment, only one touch electrode 310 is shown, however a plurality of touch electrodes 310 are formed, and according to a method of sensing the touch, the touch may be sensed by a self-capacitance type or a mutual-capacitance type in which the touch is sensed by two touch electrodes that extend in directions that cross each other.

According to an embodiment, the polarization layer 210 is disposed on the touch sensing layer 300, and the window 220 is attached by the adhesive layer 230 disposed on the polarization layer 210.

According to an embodiment, the polarization layer 210 prevents light incident from the outside from being reflected by the touch electrode 310 and recognized by the user, and the window 220 protects the touch sensing layer 300 and the display panel 100 and may have an additional coating layer when necessary.

According to an embodiment, the display device 10 further includes the driver 500 formed at one side of the display panel 100. The driver 500 is disposed on one side of the substrate 110 and drives the pixels and senses a touch. In addition, various pads are formed in the periphery of the driver 500 to be connected to the driver.

According to an embodiment, the driver 500 is a driving chip attached directly to the substrate 110 when the substrate 110 is flexible. Alternatively, according to another embodiment, an additional flexible substrate can be attached to one side of the substrate 110, and a driving chip is formed on the flexible substrate.

Referring to FIG. 3, according to an embodiment, the polarization layer 210, the adhesive layer 2 and the window 220 are also formed in the peripheral areas 102, 103, and 104. In particular, when the polarization layer 210 is disposed on the open region 103, an empty space is formed in the peripheral opening 326 and filled with air. However, according to an embodiment, the high refractive index layer 330 material may be disposed in some regions of the peripheral opening 326.

Referring to FIG. 1, according to an embodiment, the peripheral areas 102, 103, and 104 are formed along the periphery of the display device and have one open region 103 and one outer dam region 102. In addition, the extension region 104 extends to the open region 103 from the edge of the display area 101, and the touch electrode passivation layer 320 is continuously formed from the display area 101 to the extension region 104.

Hereinafter, a variation of an embodiment of FIG. 1 is described with reference to FIG. 4 and FIG. 5.

In an embodiment of FIG. 3, since a criteria for dividing the peripheral areas 102, 103, and 104 is based on the structure of the touch electrode passivation layer 320 of the touch sensing layer 300, not the display panel 100, the opening and the first dam structure are formed only in the touch sensing layer 300, and the openings do not extend into the peripheral areas 102, 103, and 104 of the display panel 100.

Figure 4:
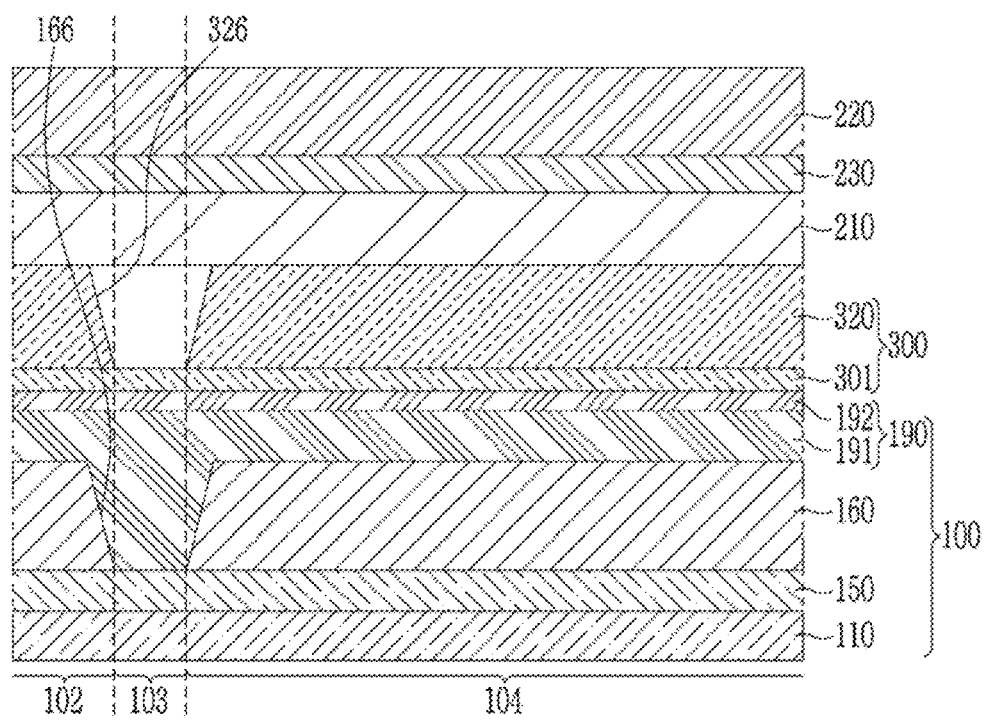
FIG. 4 and FIG. 5 are cross-sectional views according to a variation of an embodiment of FIG. 3.
Figure 5:
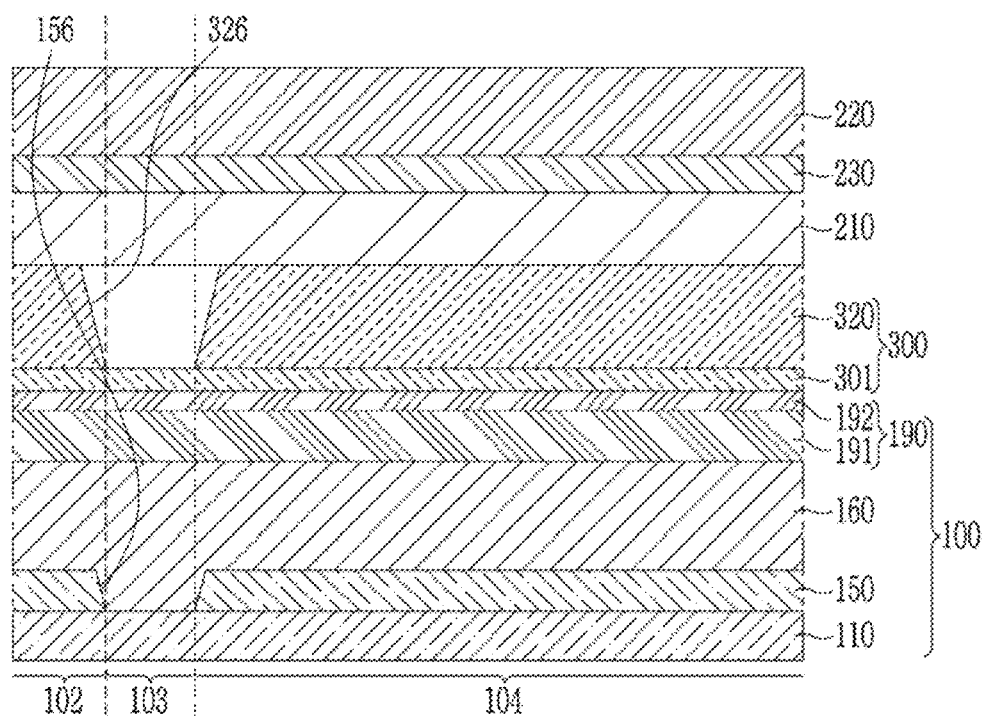

However, in embodiments of FIG. 4 and FIG. 5, an opening is formed in the peripheral areas 102, 103, and 104 of the display panel 100.

FIG. 4 and FIG. 5 are cross-sectional views according to a variation of an embodiment of FIG. 3.

First, an embodiment of FIG. 4 is described.

In an embodiment of FIG. 4, unlike the embodiment of FIG. 3, an opening 166, hereinafter referred to as a partition layer peripheral opening, that corresponds to the open region 103 is formed in the partition layer 160 of the display panel 100.

According to an embodiment, in the touch electrode passivation layer 320, a mask used when forming the peripheral opening 326 is the same as a mask used when forming the partition layer peripheral opening 166 in the partition layer 160, which reduces a manufacturing cost. As a result, a position of the peripheral opening 326 coincides with a position of the partition layer peripheral opening 166 in the open region 103 of FIG. 4.

As shown in FIG. 4, according to an embodiment, an organic encapsulation layer 191 of an encapsulation layer 190 is disposed within and fills the partition layer peripheral opening 166. However, embodiments are not limited thereto, and in other embodiments, the inorganic encapsulation layer 192 is disposed in the partition layer peripheral opening 166 instead of the organic encapsulation layer 191.

Next, an embodiment of FIG. 5 is described.

In an embodiment of FIG. 5, unlike an embodiment of FIG. 4, an opening is not formed in the partition layer 160 of the display panel 100, but rather an interlayer insulating layer peripheral opening 156 is formed in the interlayer insulating layer 150.

According to an embodiment, the mask used when forming the peripheral opening 326 in the touch electrode passivation layer 320 and the mask used when forming the interlayer insulating layer peripheral opening 156 in the interlayer insulating layer 150 are the same mask to reduce the manufacturing cost. As a result, a position of the peripheral opening 326 and a position of the interlayer insulating layer peripheral opening 156 coincide within the open region 103 as shown in FIG. 5.

As shown in FIG. 5, according to an embodiment, the partition layer 160 is disposed within and fills the interlayer insulating layer peripheral opening 156.

Like the embodiment of FIG. 4 and FIG. 5, the openings 156 and 166 are formed in the display panel 100 to prevent organic material from overflowing the outer dam region 102 through the open region 103 when forming the display panel 100 and the touch electrode layer 300 by an inkjet method. An embodiment of FIG. 4 prevents the material for the organic encapsulation layer 191 from flowing through the peripheral area, and an embodiment of FIG. 5 prevents the material for the partition layer 160 from flowing through the peripheral area. Due to this structure, even when an organic material sprayed by an inkjet method flows into the peripheral area, the organic material is prevented from reacting with the laser such that the carbonized foreign materials are not generated and do not to cover alignment marks formed for substrate alignment.

In the above, an embodiment for one open region 103 has been described with reference to FIG. 1.

Next, an embodiment having two dam structures in which two open regions are formed is described with reference to FIG. 6 to FIG. 10.

First, an embodiment having two dams and two open regions is described with reference to FIG. 6 to FIG. 8.

Figure 6:
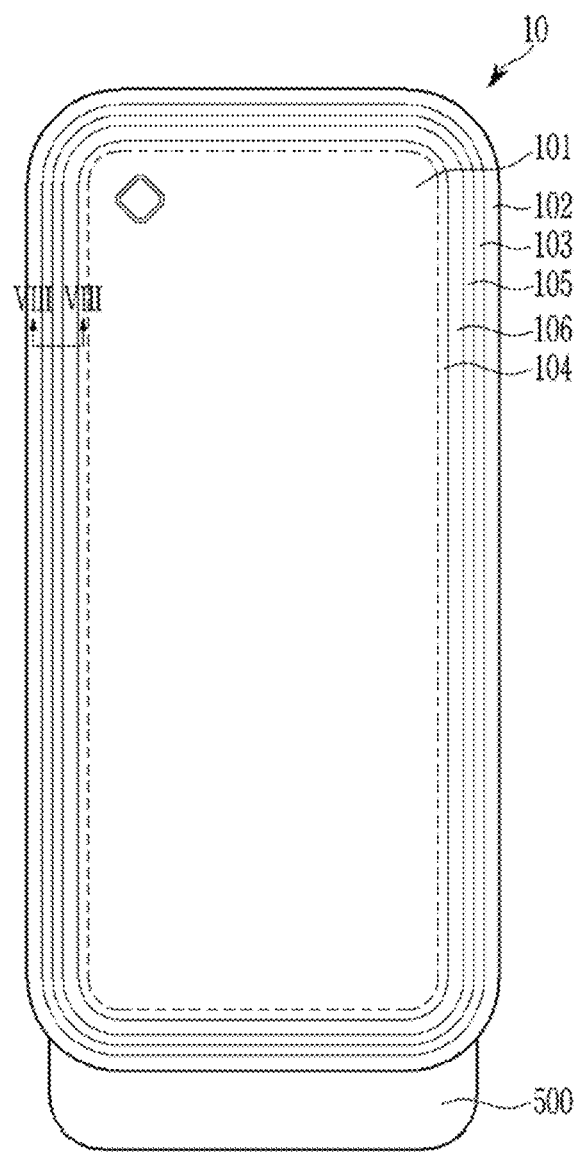
FIG. 6 is a schematic front view of a display device according to another embodiment.
Figure 7:
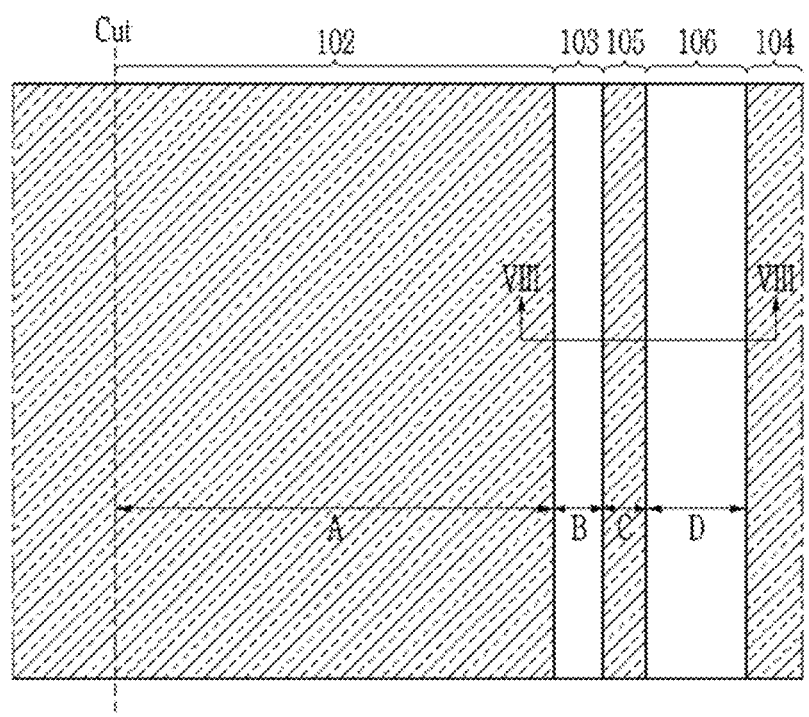
FIG. 7 is an enlarged view of a part of FIG. 6.
Figure 8:
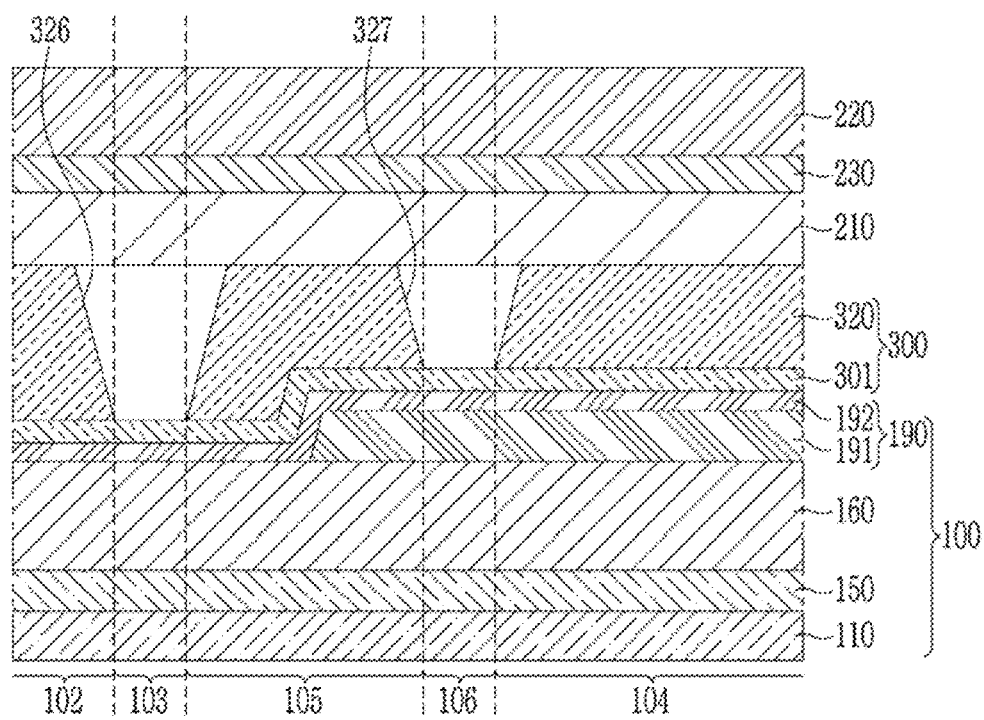
FIG. 8 is a cross-sectional view taken along a line VIII-VIII of FIG. 7.

FIG. 6 is a schematic front view of a display device according to another embodiment, FIG. 7 is an enlarged view of a part of FIG. 6, and FIG. 8 is a cross-sectional view taken along a line VIII-VIII of FIG. 7.

In FIG. 6, according to an embodiment, a peripheral area differs from that of FIG. 1 in that there are two dam regions 102 and 105 and two open regions 103 and 106.

A peripheral area according to an embodiment of FIG. 6 includes the outer dam region 102, the open region 103, an inner dam region 105, an additional open region 106, and the extension region 104. The extension region 104 is a space between the display area 101 and the additional open region 106.

According to an embodiment of FIG. 6, the inner dam region 105 and the additional open region 106 are additionally formed between the extending region 104 and the open region 103, as compared with an embodiment of FIG. 1.

According to an embodiment, the additional open region 106 is disposed between the open region 103 and the extension region 104, and is a region where no touch electrode passivation layer 320 is formed.

According to an embodiment, the inner dam region 105 is disposed outside the additional open region 106, and a second dam structure formed of a same material and with a same height as the touch electrode passivation layer 320 is formed.

In an embodiment of FIG. 6, the display area 101 is the same as that of FIG. 2. The pixel opening 165 is formed in the touch electrode passivation layer 320, and the high refractive index layer 330 is disposed in and fills the pixel opening 165. As a result, the light of the organic light emitting diode emitted through the pixel opening 165 meets the slope of the touch electrode passivation layer 320 and is reflected so that the light is emitted in a direction substantially normal to the front side of the display device 10. Since more light is emitted normal to the front surface in this way, less light is emitted to the side, which improves the light efficiency at the front surface.

An embodiment of FIG. 6 shows the structure of the touch electrode passivation layer 320 of the touch sensing layer 300 in the peripheral area, and also additionally shows the region before being cut by the laser. In FIG. 7, the dotted line shown as Cut shows the part cut by the laser.

In an embodiment of FIG. 6, the peripheral areas 102, 103, 104, 105, and 106 are form five regions, and a classification of the regions is based on the structure of the touch electrode passivation layer 320 of the touch sensing layer 300. That is, referring to FIG. 6 to FIG. 8, the touch electrode passivation layer 320 of the touch sensing layer 300 is formed in the display area 101 and the partial regions 102, 104, and 105 of the peripheral area, and the touch electrode passivation layer 320 is not formed in the open region 103 and the additional open region 106 disposed therebetween, so that the peripheral opening 326 and the additional peripheral opening 327 are formed. The touch sensing insulating layer 301 is exposed in the open region 103 and the additional open region 106. The outer dam region 102 is located outward from the peripheral opening 326, the inner dam region 105 is located between the peripheral opening 326 and the additional peripheral opening 327, and the extension region 104 is located between the additional peripheral opening 327 and the display area 101.

Referring to FIG. 7, according to an embodiment, the region cut to be removed is located outside the outer dam region 102, and the touch electrode passivation layer 320 is also formed in this region and is subsequently removed in the cutting process.

Referring to FIG. 8, according to an embodiment, the high refractive index layer 330 is not formed in the peripheral areas 102, 103, 104, 105, and 106. That is, by an inkjet method, the material for the high refractive index layer 330 is not sprayed on the peripheral areas 102, 103, 104, 105, and 106. However, the high refractive index layer 330 material can flow from the display area 101 to the peripheral areas 102, 103, 104, 105, and 106. In this case, in the peripheral area 102, 103, 104, 105, and 106, since there are two regions 102 and 105 in which two dam structures are formed and two openings 326 and 327, even if the high refractive index layer 330 material is formed in some of the extension region 104 or past the extension region 104, the material is confined within the two openings 326 and 327 so that there is no material formed above or beyond the outer dam region 102. In this case, of the peripheral areas 102, 103, 104, 105, and 106, the high refractive index layer 330 material is formed on the extension region 104, within the additional open region 106, within the inner dam region 105, or within the open region 103. In FIG. 8, the high refractive index layer 330 material is omitted for clarity.

According to an embodiment, if the high refractive index layer 330 material flows past the outer dam region 102, defects can occur in subsequent processes. That is, as shown in FIG. 7, when cutting the substrate by using the laser along a cutting line (Cut), the high refractive index layer 330 material can react with the laser to generate carbonized foreign materials, which cover the alignment marks formed for the substrate alignment, and as a result, a misalignment can occur.

To prevent this situation from occurring, in a present embodiment, in the inner dam region 105, the outer dam region 102, the open region 103, and the additional open region 106, two dam structures and two openings 326 and 327 are formed in the layer of the touch electrode passivation layer 320 and below the layer of the high refractive index layer 330 material so that the high refractive index layer 330 material does not flow past the outer dam region 102.

According to an embodiment, the touch sensing insulating layer 301 is disposed below the touch electrode passivation layer 320, is formed of silicon nitride (SiNx), and is exposed by the two openings 326 and 327 in the open region 103 and the additional open region 106, respectively.

Referring to FIG. 8, according to an embodiment, the polarization layer 210 and the window 220 are also formed in the peripheral areas 102, 103, 104, 105, and 106. In particular, when the polarization layer 210 is disposed on the open region 103 and the additional open region 106, an empty space is formed in the peripheral opening 326 and the additional peripheral opening 327, and is filled with air.

However, according to an embodiment, the high refractive index layer 330 material may flow to be disposed in some regions of the peripheral opening 326.

In addition, according to an embodiment, the encapsulation layer 190 extends to the end of the peripheral areas 102, 103, 104, 105, and 106. In FIG. 8, the organic encapsulation layer 191 extends to the inner dam region 105 through the additional open region 106 and the extending region 104, and the inorganic encapsulation layer 192 extends to cover the remaining regions of the inner dam region 105, the outer dam region 102, and the open region 103. With the exception of the organic encapsulation layer 191, the inorganic encapsulation layer 192 and touch sensing insulating layer 301 have a stepped structure having a step. However, embodiments are not limited thereto, and organic encapsulation layer 191 may be formed in portions of the peripheral areas 102, 103, 104, 105, and 106.

Referring to FIG. 6, according to an embodiment, the peripheral areas 102, 103, 104, 105, and 106 are located along the periphery of the display device, and have two open regions, the open region 103 and the additional open region 106, and two dam regions, the inner dam region 105 and the outer dam region 102. In addition, the extension region 104 extends to the additional open region 106 outside the display area 101, and the touch electrode passivation layer 320 continuously extends from the display area 101 to the extension region 104.

As shown in FIG. 6, according to an embodiment, the size of of the peripheral areas 102, 103, 104, 105, and 106 located outside of the display device varies depending on the structure of the display device. In FIG. 6, a structure in which the driver 500 is disposed below the display device 10 is shown, and thus, the display device 10 has wider peripheral areas 102, 103, 104, 105, and 106.

Referring to FIG. 7, according to an embodiment, the widths of the outer dam region 102, the open region 103, the inner dam region 105, and the additional open region 106 are indicated by A, B, C, and D, respectively. The width of each region varies depending on whether the region is the upper side, the left of right side, or the lower side of the display device 10, and the width of each region according to an embodiment of FIG. 6 is shown in Table 1 below.

TABLE 1

|  | Left side | Right side | Upper side | Lower side |
| --- | --- | --- | --- | --- |
| Width A of outer dam region 102 |  |  | 380 μm |  |
| Width B of open region 103 | 50 μm |  | 40 μm | 100 μm |
| Width C of inner dam region 105 |  |  | 40 μm |  |
| Width D of additional open region 106 |  |  | 100 μm |  |

Here, the reference of the left side, the right side, the upper side, and the lower side is based on FIG. 6.

On the other hand, Table 1 does not show the width of the extension region 104. However, according to an embodiment, the extension region 104, which extends from the display area 101, is where wires connected to the display area 101 are formed, and has different widths according to the number of wires, and has a width of 200-300 μm depending on an embodiment.

According to an embodiment, the values presented in Table 1 are actual experimental values for FIG. 11, and the high refractive index layer 330 material is not formed beyond the peripheral areas 102, 103, 104, 105, and 106 when being formed in FIG. 11 below.

According to an embodiment, the width A of the outer dam region 102 may be 300 μm to 600 μm, the width B of the open region 103 may be 20 μm to 200 μm, the width C of the inner dam region 105 may be 20 μm to 100 μm, and the width D of the additional open region 106 may be 50 μm to 200 μm.

In particular, according to an embodiment, the widths of the peripheral areas 102, 103, 104, 105, and 106 located below the display area 101 are the same as or greater than the widths of the peripheral areas 102, 103, 104, 105, and 106 of other portions. In an embodiment of FIG. 7, the width of the open region 103 that finally blocks the material of the high refractive index layer 330 is greatest at the lower side, thereby creating a configuration that prevents the inflow of the high refractive index layer 330 material to protect the driver 500 disposed at the lower side, the pad attached to the driver 500, and the wiring.

Figure 9:
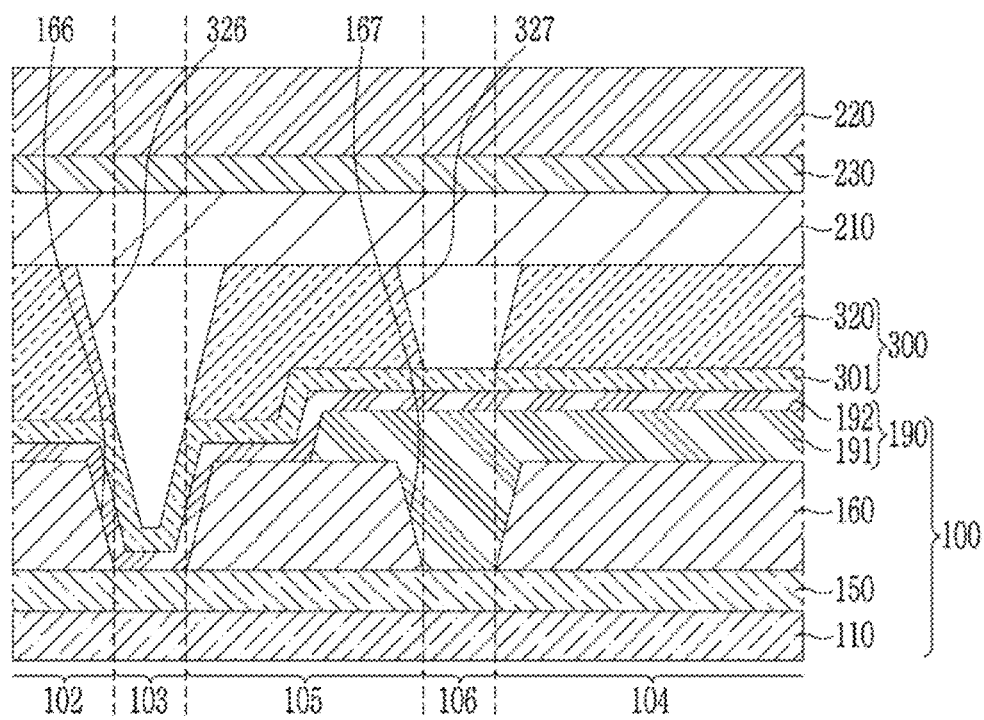
FIG. 9 and FIG. 10 are cross-sectional views according to a variation of an embodiment of FIG. 8.
Figure 10:
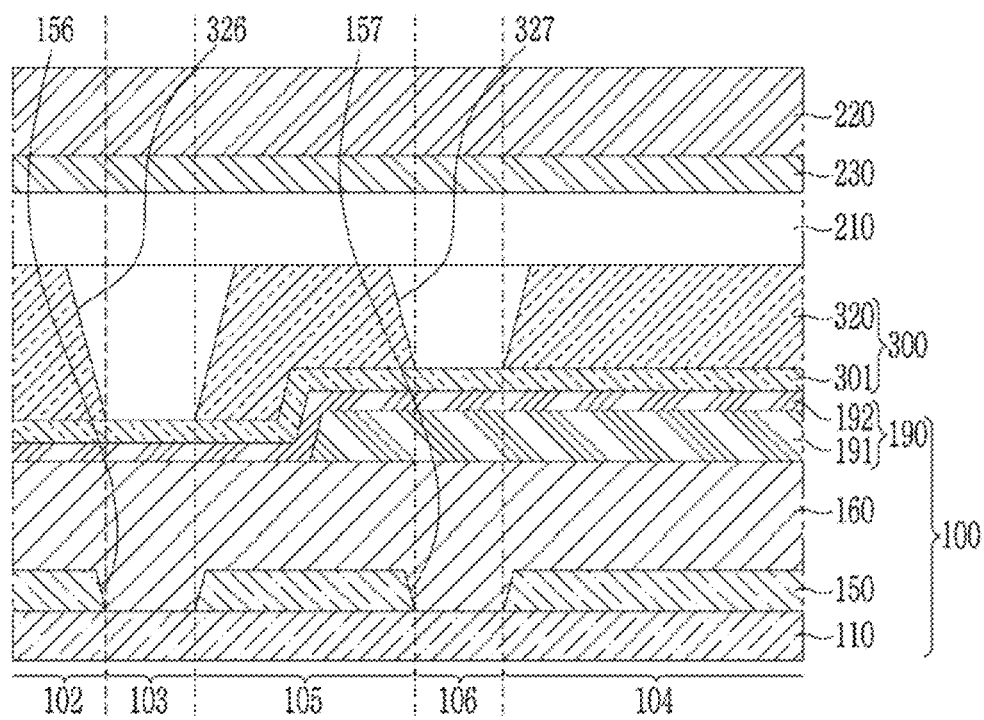

Next, a variation of the embodiment of FIG. 8 is described using FIG. 9 and FIG. 10.

In an embodiment of FIG. 8, the peripheral areas 102, 103, 104, 105, and 106 are classified based on the structure of the touch electrode passivation layer 320 of the touch sensing layer 300, not the display panel 100. That is the peripheral opening 326 and the additional peripheral opening 327 are located where the touch electrode passivation layer 320 is not formed, to form the open region 103 and the additional open region 106, respectively, and the inner dam region 105, the outer dam region 102 and the extending region 104 are formed in the remaining areas.

At this time, according to an embodiment, the openings do not extend into the peripheral areas 102, 103, 104, 105, and 106 of the display panel 100.

However, in an embodiment of FIG. 9 and FIG. 10, two openings are respectively formed in the peripheral areas 102, 103, 104, 105, and 106 of the display panel 100.

FIG. 9 and FIG. 10 are cross-sectional views according to a variation of an embodiment of FIG. 8.

First, an embodiment of FIG. 9 is described.

In an embodiment of FIG. 9, unlike an embodiment of FIG. 8, the partition layer 160 of the display panel 100 includes an opening 166, referred to as the partition layer peripheral opening, that corresponds to the open region 103 and an opening 167, referred to as the additional partition layer peripheral opening, that corresponds to the additional open region 106.

According to an embodiment, the mask used when forming the peripheral opening 326 and the additional peripheral opening 327 in the touch electrode passivation layer 320 is the same as the mask used when forming the partition layer peripheral opening 166 and the additional partition layer peripheral opening 167 in the partition layer 160, which reduces the manufacturing cost. As a result, the position of the peripheral opening 326 and the position of the partition layer peripheral opening 166 coincide within the open region 103, as shown in FIG. 9, and the position of the additional peripheral opening 327 and the position of the additional partition layer peripheral opening 167 coincide within the additional open region 106.

As shown in FIG. 9, according to an embodiment, an encapsulation layer 190 is disposed within the partition layer peripheral opening 166 and the additional partition layer peripheral opening 167, and extends from the extension region 104 into the outer dam region 102. In a present embodiment, the organic encapsulation layer 191 is disposed within the additional partition layer peripheral opening 167, but does not extend into the partition layer peripheral opening 166, and the inorganic encapsulation layer 192 extends into the outer dam region 102, as shown in FIG. 9. However, embodiments are not limited thereto, and in other embodiments, only an inorganic encapsulation layer 192 is disposed, rather than the organic encapsulation layer 191.

Next, an embodiment of FIG. 10 is described.

In an embodiment of FIG. 10, unlike an embodiment of FIG. 9, rather than forming the opening the partition layer 160 of the display panel 100, an interlayer insulating layer peripheral opening 156 and an additional interlayer insulating layer peripheral opening 157 are formed in the underlying interlayer insulating layer 150.

According to an embodiment, the mask used when forming the peripheral opening 326 and the additional peripheral opening 327 in the touch electrode passivation layer 320 is the same as the mask used when forming the interlayer insulating layer peripheral opening 156 and the additional interlayer insulating layer peripheral opening 157 in the interlayer insulating layer 150, which reduces the manufacturing cost. As a result, the position of the peripheral opening 326 and the position of the interlayer insulating film peripheral opening 156 coincide within the open region 103 as shown in FIG. 10, and the position of the additional peripheral opening 327 and the position of the additional interlayer insulating layer peripheral opening 157 coincide within the additional open region 106.

As shown in FIG. 10, according to an embodiment, the partition layer 160 is disposed within and fills the interlayer insulating layer peripheral opening 156 and the additional interlayer insulating layer peripheral opening 157.

In an embodiment of FIG. 9 and FIG. 10, the openings 156, 157, 166, and 167 in the display panel 100 are formed to prevent organic material being sprayed by an inkjet method from overflowing the outer dam region 102 from the open region 103 when forming the display panel 100 and the touch electrode layer 300. When organic material sprayed by the inkjet method flows into the peripheral area, the organic material can react with the laser and form carbonized foreign materials, and such carbonized foreign materials may block the alignment marks formed to align the substrate, which may cause misalignment.

According to an embodiment, a result of examining whether the high refractive index layer 330 material is properly blocked in an embodiment of FIG. 6 is described with reference to FIG. 11 to FIG. 13.

Figure 11:
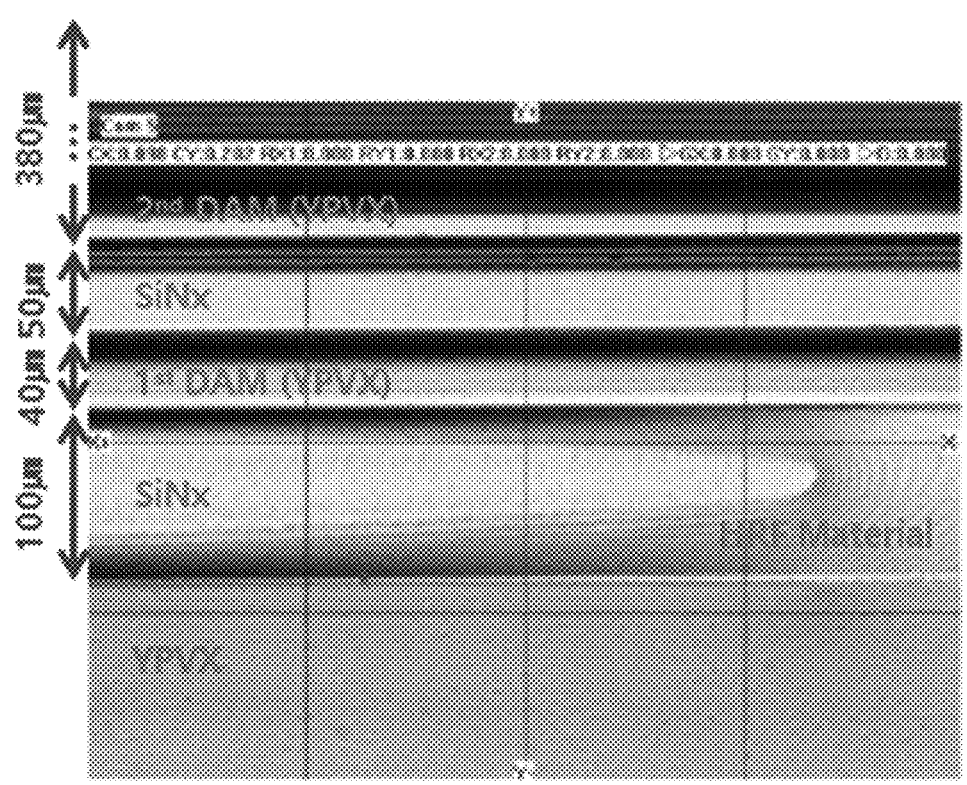
FIG. 11 to FIG. 13 show that material does not flow over a dam, according to a present embodiment.
Figure 12:
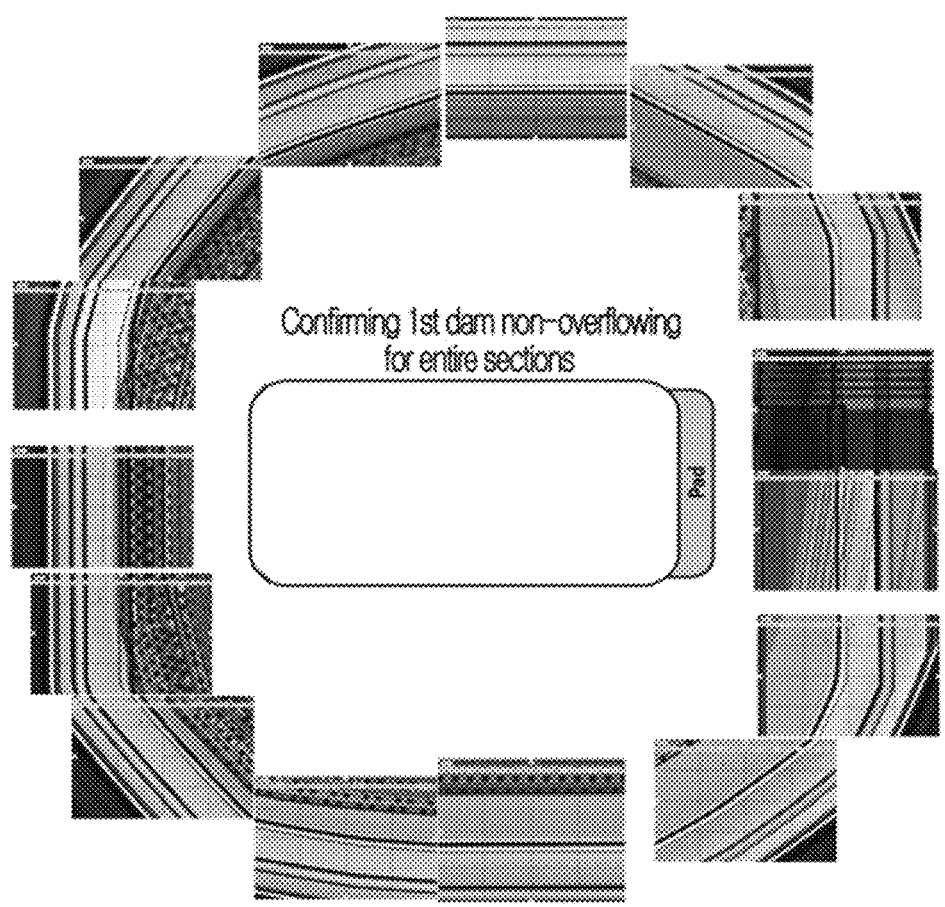
Figure 13:
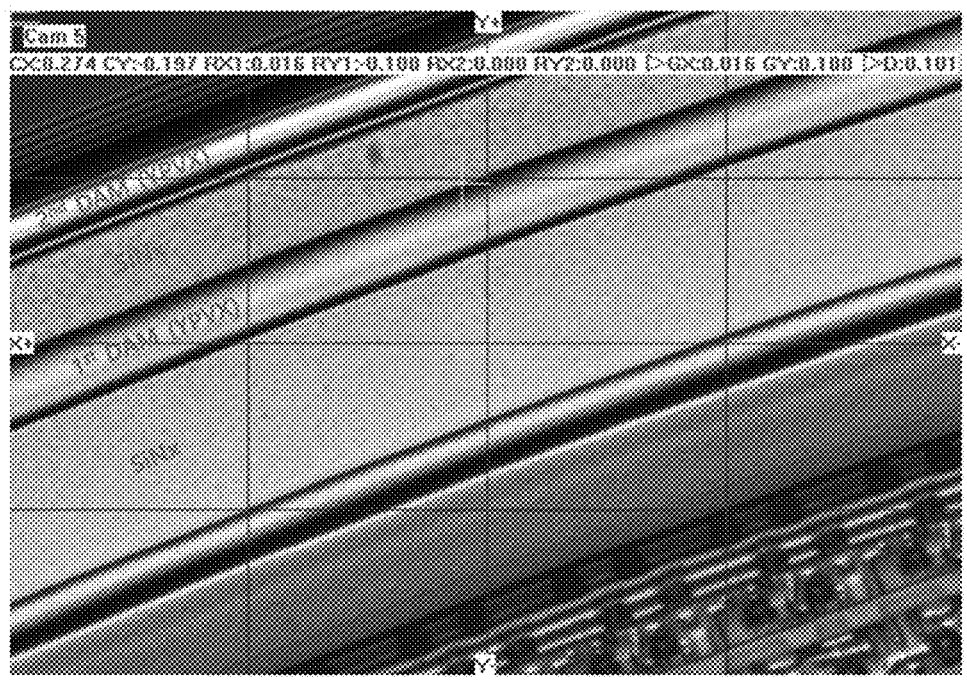

FIG. 11 to FIG. 13 show that material does not flow over a dam, according to a present embodiment.

First, according to an embodiment, the values shown in FIG. 11 represent the widths and correspond to the values on the left and right in Table 1 above. Therefore, in FIG. 11, the peripheral areas 102, 103, 104, 105, and 106 on the left or right side of the display device 10 are photographed.

In FIG. 11, YPVX represents the touch electrode passivation layer 320, and SiNx represents the exposed touch sensing insulating layer 301 in an embodiment in which the touch sensing insulating layer 301 is formed of silicon nitride. That is, in FIG. 11, the outer dam region 102 is shown by $2^{nd}$ DAM (YPVX) and 380 μm, the open region 103 is shown by SiNx and 50 μm, the inner dam region 105 is shown by $1^{st}$ DAM (YPVX) and 40 μm, and the additional open region 106 is shown by SiNx and 100 μm.

In FIG. 11, according to an embodiment, in the additional open region 106 (SiNx, 100 μm), the shape of the HRF material flow is photographed, and here, the HRF material is a high refractive film and refers to the material for the high refractive index layer 330. That is, although the high refractive index layer 330 material flows in the additional open region 106, the high refractive index layer 330 material does not appear in the open region 103. As a result, it can be confirmed that the material does not overflow the inner dam region 105, where the dam is disposed, and no high refractive index layer 330 material passing through the open region 103 and beyond the outer dam region 102, and accordingly, no carbonized foreign materials occur during the laser cutting.

According to an embodiment, FIG. 12 shows a result that confirms that the material does not overflow any portion of the inner dam region 105, where the dam is disposed, by photographing each portion of the display device 10 like FIG. 11.

FIG. 13 is a photograph of a display device according to another embodiment, and it confirms that the high refractive index layer 330 material does not flow into the open region 103 between the outer dam region 102 and the inner dam region 105. As a result, there is no high refractive index layer 330 material that flows beyond the outer dam region 102, so no carbonized foreign materials are generated during the laser cutting.

As confirmed in FIG. 11 to FIG. 13, according to an embodiment, no high refractive index layer 330 material flowing into the open region 103 after overflowing the inner dam region 105 is identified. Therefore, according to an embodiment, one open region and one dam structure are formed, and accordingly, in an embodiment of FIG. 1 to FIG. 5 with one open region and one dam structure, no high refractive index layer 330 material flows over the outer dam region 102, and no carbonized foreign materials are generated when cutting by the laser.

In the following, a variation of an embodiment of a dam structure formed in the outer dam region 102 or the inner dam region 105 is described with reference to FIG. 14 and FIG. 15.

Figure 14:
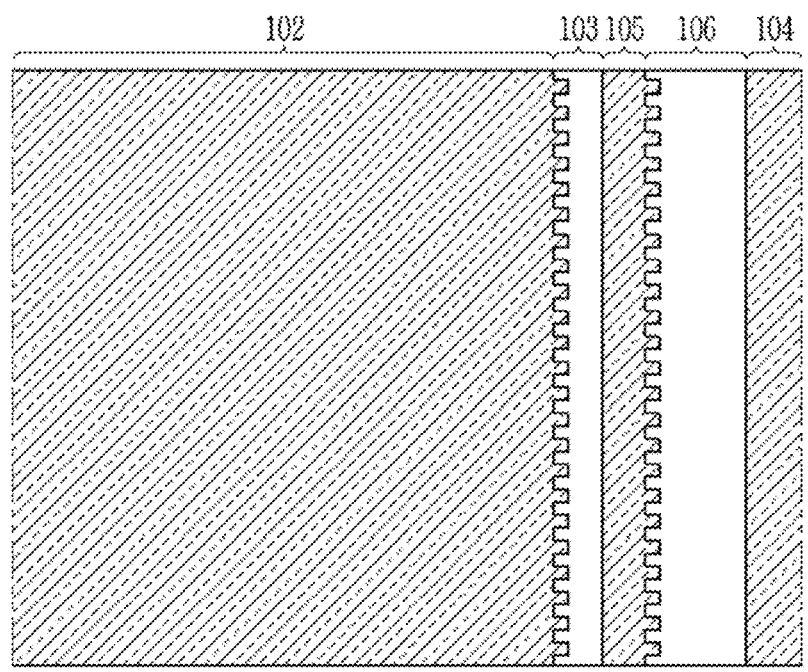
FIG. 14 and FIG. 15 show a variation of a dam structure according to an embodiment.
Figure 15:
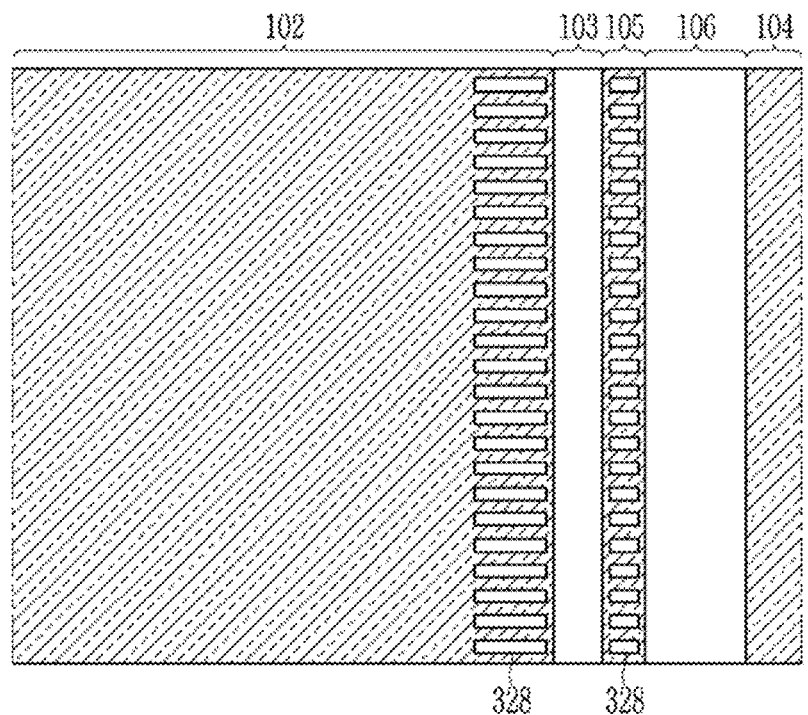

FIG. 14 and FIG. 15 show a variation of a dam structure according to an embodiment.

First, FIG. 14 shows an embodiment in which the inner wall surfaces of the dam structures between the outer dam region 192 and the open region 103, and between the inner dam region 105 and the additional open region 106, have a structure in which a protruded portion and a recessed portion are repeatedly formed. The structure of the dam that includes the protruded portions, hereinafter also referred to as an inner protruded portion, hinders the flow of the high refractive index layer 330 material across the dam, while the protruded portion and the recessed portion increase the surface tension when the high refractive index layer 330 material flows from the inside. FIG. 14 shows inner protruded portion that are relatively large, but the inner protruded portion may be much smaller. The degree and size of the protrusions of the inner protruded portion may vary according to an embodiment. In addition, unlike FIG. 14, the inner protruded portion may have an oscillating curved line structure rather than square wave shape. According to an embodiment, the recessed portion may also have an oscillating curved line shape.

An embodiment of FIG. 14 shows a structure in which the protruded portion is included in both of the outer dam region 102 and the inner dam region 105, however, according to other embodiments, the inner surface has the protruded portion only in one of the two dam structures.

In addition, an embodiment of FIG. 1 can be transformed into an embodiment in which there is a protruded portion on the inner surface of the outer dam region 102.

Next, FIG. 15 shows an embodiment of a dam structure in which dam openings 328 are additionally formed in the dam structures. The dam openings 328 are formed on the upper surface of the dam structure in dam regions 102 and 105, and even if the high refractive index layer 330 material overflows the dam structure, the high refractive index layer 330 material is trapped inside the dam openings 328 so that the material does not flow outward.

FIG. 15 shows only a simple rectangle, specifically a rectangular column structure, as the form of the dam opening 328, but embodiments are not limited thereto, and in other embodiments, the dam opening 328 may have a variety of other structures, such as a circular cylinder.

In addition, according to embodiments, the depth of the dam opening 328 may vary. That is, the depth of the dam opening 328 may be the same as the height of the dam structure so that the underlying touch sensing insulating layer 301 is exposed. Alternatively, the lower portion of the dam opening 328 may be blocked, so that the touch sensing insulating layer 301 is not exposed, and in this case, the height of the dam opening 328 may vary.

In addition, FIG. 15 shows an embodiment in which the sizes of the dam openings 328 formed in the outer dam region 102 differ from the sizes of the dam openings 328 formed in the inner dam region 105. Two dam openings 328 need not be identical in size, and may differ in shape, size, and depth.

An embodiment of FIG. 15 shows a structure in which the dam opening 328 is respectively included in both of the outer dam region 102 and inner dam region 105, however embodiments are not limited thereto, and in other embodiment, only one dam structure of two dams has the opening.

Next, a blocking characteristic for the high refractive index layer 330 material that depends on the dam structure of an embodiment of FIG. 14 and FIG. 15 is described with reference to FIG. 16 to FIG. 18.

Figure 16:
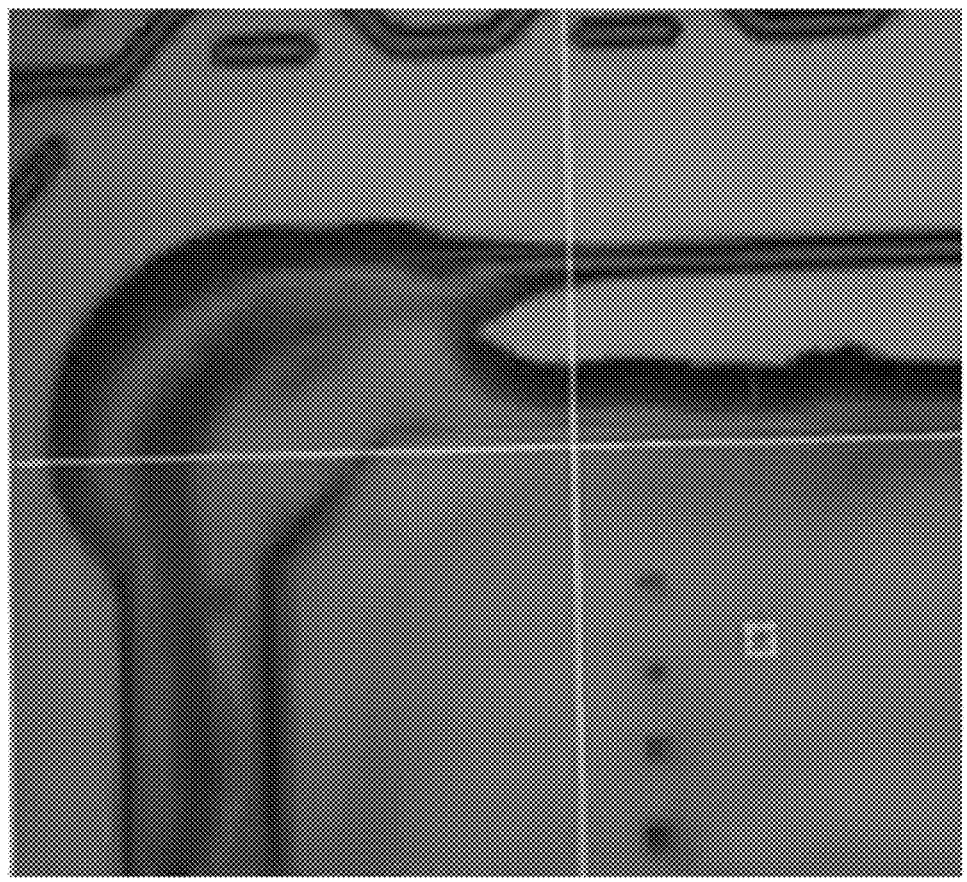
FIG. 16 to FIG. 18 show that whether a material flows over a dam depends on a dam structure, according to an embodiment.
Figure 17:
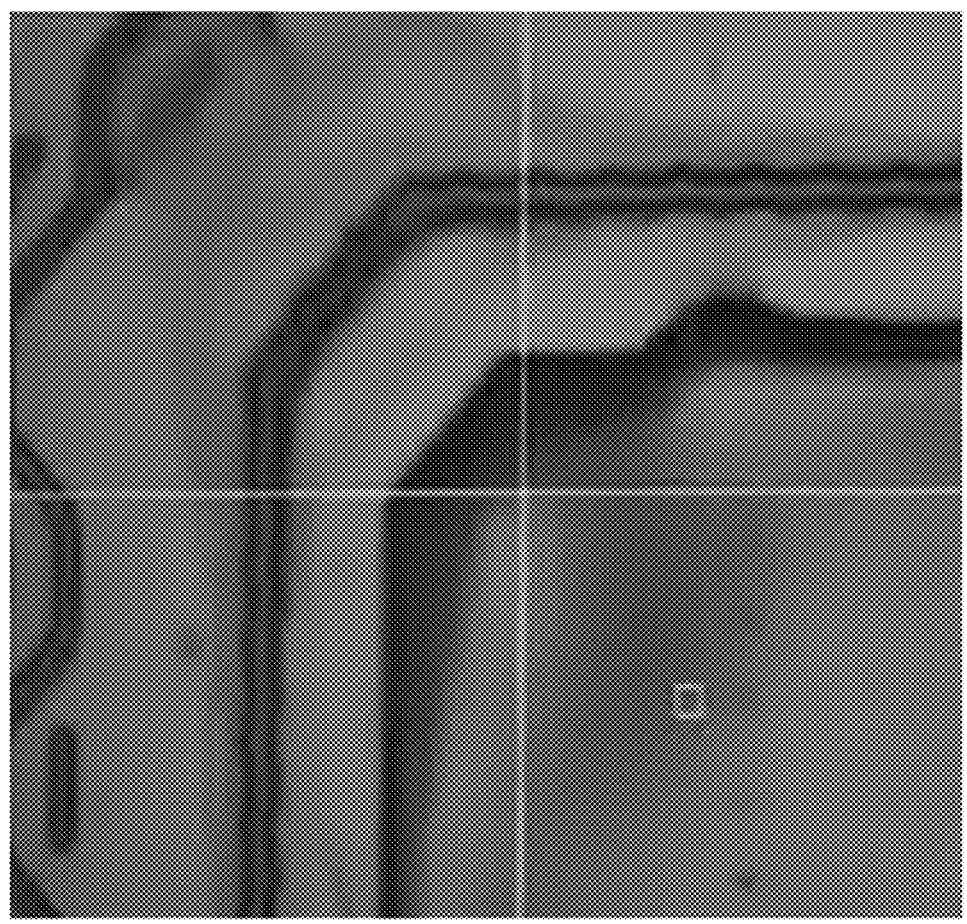
Figure 18:
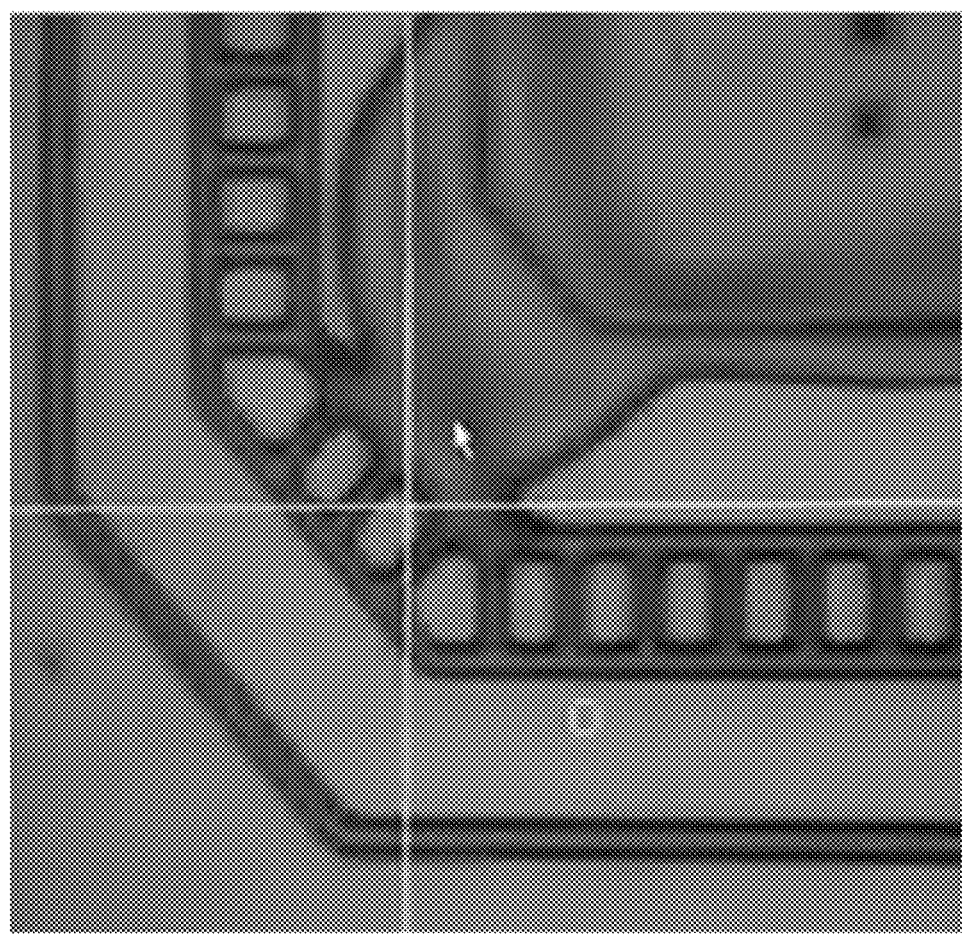

FIG. 16 to FIG. 18 show that whether a material flows over a dam depends on the dam structure.

FIG. 16 is a photograph that shows an embodiment in which the dam structure has a bar shape, like the embodiment of FIG. 1 and FIG. 6, FIG. 17 is a photograph that shows a dam structure that has the additional inner protruded portions, like FIG. 14, and FIG. 18 is a photograph that shows a dam structure having dam openings, like FIG. 15.

According to embodiments, FIG. 16 shows that the high refractive index layer 330 material is disposed beyond the dam structure and in the open region. FIG. 17 shows that the high refractive index layer 330 material is formed in a large portion of the open region beyond the dam structure, thus showing that the blocking ability of the high refractive index layer 330 material is lower than that of a dam having a bar structure.

Referring to FIG. 18, according to embodiments, the high refractive index layer 330 material does not flow past the dam structure. Thus it can be seen that of three embodiments, a dam structure of FIG. 18 has the strongest ability to block the high refractive index layer 330 material. However, FIG. 18 shows that the dam structures are wide to form the dam openings.

While embodiments of this disclosure have been described in connection with what is presently considered to be practical embodiments, it is to be understood that embodiments of the disclosure are not limited to the disclosed embodiments. On the contrary, it is intended to cover various modifications and equivalent arrangements included within the spirit and scope of the appended claims.

What is claimed is:

1. A display device comprising:
    a display panel that includes a display area and a peripheral area around the display area;
    an encapsulation layer disposed on the display panel, wherein the encapsulation layer comprises a first monomer;
    a touch electrode disposed on the encapsulation layer;
    a touch insulation layer disposed over the touch electrode;
    a second monomer disposed over the touch insulation layer;
    a first dam and a second dam disposed in the peripheral area wherein the first dam disposed between the display are and the second dam; and
    a polarization layer that overlaps the second dam,
    wherein the second monomer overlaps the first dam in a plan view.

2. The display device of claim 1, wherein the touch insulation layer overlaps the first dam.

3. The display device of claim 1, wherein the polarization layer also overlaps the first dam and the display area.

4. The display device of claim 1, wherein the display panel includes a partition layer that includes a first opening through which light is emitted from an organic light emitting diode in the display area.

5. The display device of claim 4, wherein the partition layer further includes a partition layer peripheral opening in the peripheral area.

6. The display device of claim 4, wherein the display panel further includes an interlayer insulating layer disposed under the organic light emitting diode.

7. The display device of claim 1, wherein at least one of the first dam and the second dam includes an inner protruded portion.

8. The display device of claim 1, wherein at least one of the first dam and the second dam includes a dam opening formed at an upper surface.

9. The display device of claim 1, wherein the encapsulation layer further includes at least one inorganic encapsulation layer.

10. The display device of claim 1, further comprising another touch insulation layer disposed under the touch electrode.

11. A display device, comprising:
a display panel that includes a display area and a peripheral area around the display area;
a partition layer disposed on the display area and that includes a first opening through which light is emitted from an organic light emitting diode;
a first monomer disposed on the partition layer;
a touch electrode disposed on the first monomer;
a touch insulation layer disposed on the touch electrode;
a high refractive index layer disposed on the touch insulation layer, and
a first dam and a second dam disposed in the peripheral area, wherein the first dam is disposed between the display area and the second dam,
wherein the first dam contacts the first monomer, and
wherein the high refractive index layer does not flow over the second dam.

12. The display device of claim 11, wherein the touch insulation layer overlaps the first dam.

13. The display device of claim 11, further comprising a polarization layer that overlaps the second dam.

14. The display device of claim 13, wherein the polarization layer also overlaps the first dam and the display area.

15. The display device of claim 11, wherein the display panel further includes an interlayer insulating layer disposed under the organic light emitting diode.

16. A display device, comprising:
a display panel that includes a display area and a peripheral area around the display area;
a partition layer disposed on the display area and that includes an opening through which light is emitted from an organic light emitting diode;
a first monomer disposed on the partition layer;
a touch electrode disposed on the first monomer;
a touch insulation layer disposed on the touch electrode;
a high refractive index layer disposed on the touch insulating layer; and
a first opening and a second opening disposed in the peripheral area, wherein the first opening is disposed between the display area and the second opening,
wherein the first monomer is disposed in the first opening and the high refractive index layer is disposed in the second opening.

17. The display device of claim 16, further comprising a first dam structure disposed between the first opening and the second opening in plan view.

18. The display device of claim 17, further comprising a second dam structure disposed on the peripheral area, and
wherein the second opening is disposed between the first opening and the second dam structure in a plan view.

* * * * *